United States Patent
Fuwa

(10) Patent No.: US 10,249,514 B2
(45) Date of Patent: Apr. 2, 2019

(54) SEMICONDUCTOR DEVICE AND MANUFACTURING METHOD THEREOF

(71) Applicant: ROHM CO., LTD., Kyoto-shi, Kyoto (JP)

(72) Inventor: Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 177 days.

(21) Appl. No.: 15/225,442

(22) Filed: Aug. 1, 2016

(65) Prior Publication Data

US 2017/0040185 A1    Feb. 9, 2017

(30) Foreign Application Priority Data

Aug. 7, 2015    (JP) .................................. 2015-156808

(51) Int. Cl.
| H01L 23/13 | (2006.01) |
| H01L 23/29 | (2006.01) |
| H01L 21/48 | (2006.01) |
| H01L 21/54 | (2006.01) |
| H01L 21/56 | (2006.01) |

(Continued)

(52) U.S. Cl.
CPC .......... *H01L 21/56* (2013.01); *H01L 21/4803* (2013.01); *H01L 21/4821* (2013.01); *H01L 21/54* (2013.01); *H01L 23/13* (2013.01); *H01L 23/295* (2013.01); *H01L 23/3121* (2013.01); *H01L 23/3737* (2013.01); *H01L 23/4951* (2013.01); *H01L 23/49517* (2013.01); *H01L 23/49582* (2013.01); *H01L 23/49811* (2013.01); *H01L 23/49861* (2013.01); *H01L 43/065* (2013.01); *H01L 43/10* (2013.01); *H01L 2224/16225* (2013.01); *H01L 2924/15159* (2013.01)

(58) Field of Classification Search
CPC ..... H01L 21/56; H01L 23/3121; H01L 21/54; H01L 23/13; H01L 21/4821; H01L 23/295; H01L 23/4951; H01L 21/4803; H01L 23/3737; H01L 23/49861; H01L 23/49517; H01L 23/49582; H01L 23/49811
USPC ....................................................... 257/421
See application file for complete search history.

(56) References Cited

U.S. PATENT DOCUMENTS 5,453,727 A * 9/1995 Shibasaki ......... H01L 31/03046
257/E31.022
6,184,544 B1 * 2/2001 Toda ..................... H01L 33/486
257/100

(Continued)

FOREIGN PATENT DOCUMENTS

JP    2005-277380 A    10/2005

*Primary Examiner* — Tucker J Wright
*Assistant Examiner* — Thai T Vuong
(74) *Attorney, Agent, or Firm* — Hamre, Schumann, Mueller & Larson, P.C.

(57) ABSTRACT

A semiconductor device includes a semiconductor element, a substrate formed with a recess in a main surface, a conductive layer formed on the substrate and electrically connected to the semiconductor element, and a sealing resin covering the semiconductor element. The substrate is made of an electrically insulative synthetic resin. The recess has a bottom surface on which the semiconductor element is mounted, and an intermediate surface connected to the main surface and the bottom surface. The bottom surface is orthogonal to the thickness direction of the substrate. The intermediate surface is inclined with respect to the bottom surface.

17 Claims, 13 Drawing Sheets

(51) Int. Cl.
  *H01L 23/373*  (2006.01)
  *H01L 23/495*  (2006.01)
  *H01L 23/498*  (2006.01)
  *H01L 23/31*   (2006.01)
  *H01L 43/06*   (2006.01)
  *H01L 43/10*   (2006.01)

(56) References Cited

U.S. PATENT DOCUMENTS

| | | | | |
|---|---|---|---|---|
| 2002/0008325 A1* | 1/2002 | Tominaga | H01L 23/13 | 257/778 |
| 2003/0234453 A1* | 12/2003 | Liu | H01L 21/563 | 257/778 |
| 2004/0173810 A1* | 9/2004 | Lin | H01L 33/486 | 257/100 |
| 2004/0251537 A1* | 12/2004 | Choi | H01L 21/4846 | 257/701 |
| 2006/0255713 A1* | 11/2006 | Kondo | C09K 11/025 | 313/486 |
| 2007/0161228 A1* | 7/2007 | Nakamura | H01L 21/4846 | 438/622 |
| 2008/0290491 A1* | 11/2008 | Yamano | H01L 25/105 | 257/686 |
| 2011/0143501 A1* | 6/2011 | Oda | C08L 63/00 | 438/127 |
| 2012/0322202 A1* | 12/2012 | Nishimura | H01L 21/568 | 438/107 |
| 2013/0294471 A1* | 11/2013 | Palaniswamy | H01L 33/486 | 372/43.01 |
| 2014/0038323 A1* | 2/2014 | Tsang | H01L 33/642 | 438/26 |
| 2014/0048827 A1* | 2/2014 | Inoue | H01L 33/08 | 257/88 |
| 2015/0181703 A1* | 6/2015 | Tanaka | H05K 1/0298 | 361/748 |
| 2016/0027756 A1* | 1/2016 | Takeda | H01L 23/13 | 257/737 |
| 2016/0229690 A1* | 8/2016 | Nakao | H01L 23/49579 | |

\* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method of semiconductor devices. In particular, the invention relates to a semiconductor device, and its manufacturing method, that includes a microprocessed silicon substrate upon which a Hall-effect element is mounted.

2. Description of the Related Art

Recently, micromachines, or micro electro mechanical system (MEMS), have been widely used as applications of LSI manufacturing technologies. To prepare a micromachine, a silicon substrate may be subjected to microprocessing technique, and required semiconductor elements are mounted on the processed silicon substrate. In manufacturing the micromachine, for instance, anisotropic etching including wet etching with an alkaline solution is employed to implement the microprocessing of the substrate. By the anisotropic etching, minute recesses can be accurately formed on the silicon substrate, into which semiconductor elements are disposed.

JP-A-No. 2005-277380 discloses an LED package based on the micromachine manufacturing technique. The LED package is obtained by forming a recess (which may often be referred to as "horn" due to its shape) on a silicon substrate by anisotropic etching, and disposing an LED chip on the bottom surface of the recess. The recess is formed by anisotropic etching with respect to the (100) surface of the silicon substrate, and hence includes a side face inclined relative to the bottom surface which is formed by the (111) surface. The side face extends between the (100) surface and the bottom surface. On the bottom surface and the side face is formed an electrode (conductive layer) for electrical connection to the LED chip and various circuit boards. The electrode is formed through depositing a Ti layer (barrier layer) and a Cu layer on the bottom surface the sloped side face, for example by sputtering, and performing a patterning process by etching on the Ti layer and the Cu layer, via a mask formed by photolithography. The LED chip is mounted on the bottom surface of the recess, and then an epoxy resin (sealing resin) is filled in the recess.

When the sealing resin is heated to be cured, the silicon substrate is also subjected to the heat, and thus the silicon substrate and the resin will both undergo thermal distortion. Since the epoxy resin is higher in thermal expansion rate than Si constituting the silicon substrate, the distortion of the sealing resin is greater than that of the silicon substrate. Unfavorably, the difference in thermal distortion may cause a warp in the silicon substrate, and the resulting package may be a defective one depending on the extent of the warp.

SUMMARY OF THE INVENTION

In view of the foregoing situation, the present invention has been proposed to provide a semiconductor device that is capable of suppressing a warp in a substrate during the manufacturing process of the semiconductor device.

According to an aspect of the present invention, there is provided a semiconductor device including: a semiconductor element; a substrate having a main surface and formed with a recess that recedes from the main surface; a conductive layer formed on the substrate and electrically connected to the semiconductor element; and a sealing resin covering the semiconductor element. The substrate is made of an electrically insulative synthetic resin. The recess includes a bottom surface on which the semiconductor element is mounted and at least one intermediate surface connected to the main surface and the bottom surface. The bottom surface is orthogonal to a thickness direction of the substrate, and the intermediate surface is inclined with respect to the bottom surface.

According to another aspect of the present invention, there is provided a method of manufacturing a semiconductor device, and the method includes: preparing a substrate that is made of a synthetic resin and has a main surface with a groove formed; forming a conductive layer on the groove and the main surface of the substrate; mounting a semiconductor element on a bottom surface of the groove; and forming a sealing resin that covers the semiconductor element. The groove has a pair of intermediate surfaces that are connected to the main surface and the bottom surface and inclined with respect to the bottom surface. In preparing the substrate, the substrate is formed of the synthetic resin using a mold so that the pair of intermediate surfaces are inclined with respect to the bottom surface at the same angle.

Other features and advantages of the present invention will become more apparent from the detailed description give below with reference to the accompanying drawings.

DETAILED DESCRIPTION OF THE PREFERRED EMBODIMENTS

Embodiments of the present invention will be described below with reference to the accompanying drawings.

First Embodiment

Referring to FIG. 1 to FIG. 5, a semiconductor device A10 according to a first embodiment of the present invention will be described. For the purpose of description, the left-right direction in plan view will be referred to as first direction X, and the up-down direction, which is perpendicular to the first direction X, will be referred to as second direction Y. The first direction X and the second direction Y are both perpendicular to the thickness direction Z of the semiconductor device A10 (or substrate 1 to be described below).

Figure 1:
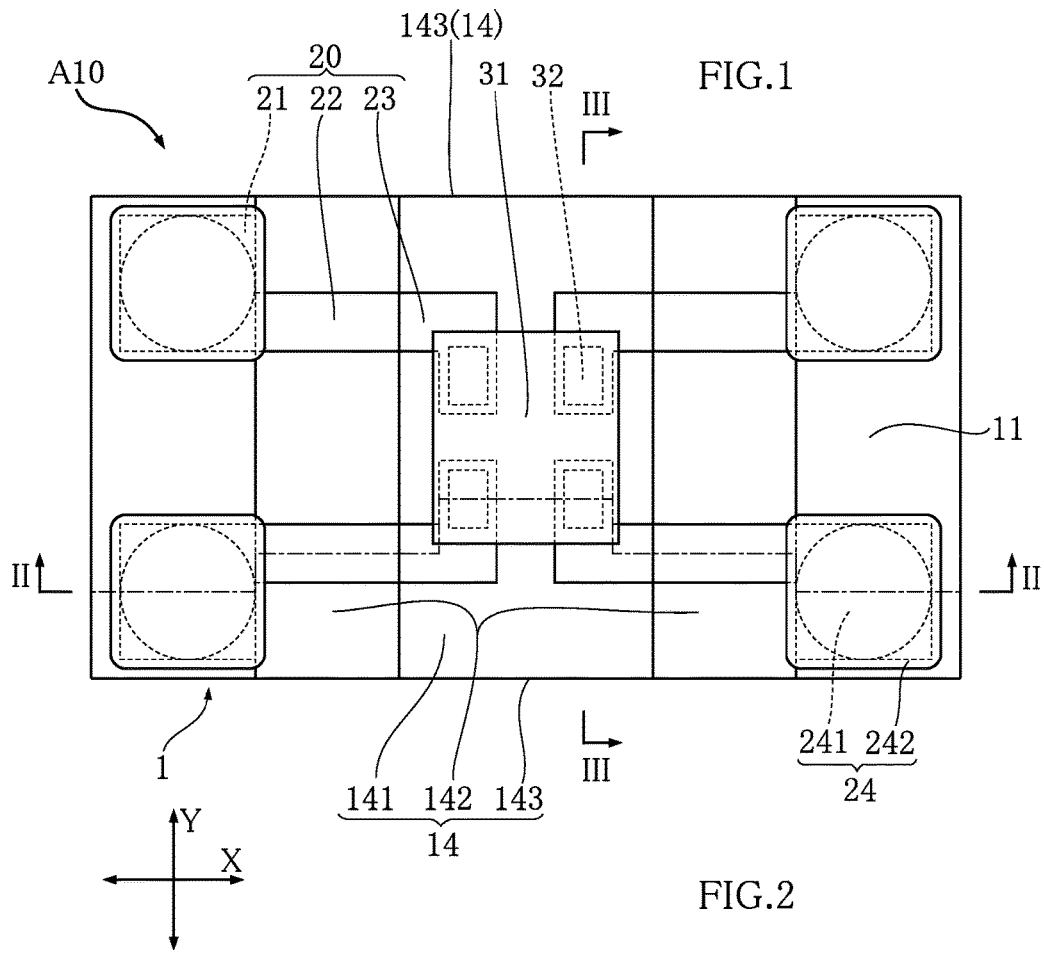
FIG. 1 is a plan view showing a semiconductor device according to a first embodiment of the present invention.
Figure 2:
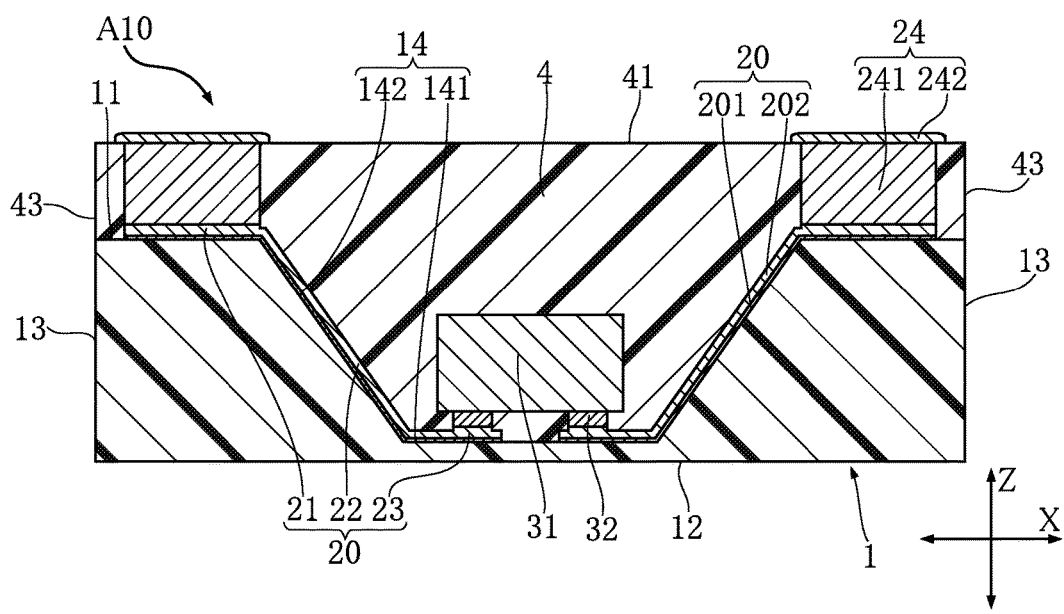
FIG. 2 is a cross-sectional view taken along a line II-II in FIG. 1.
Figure 3:
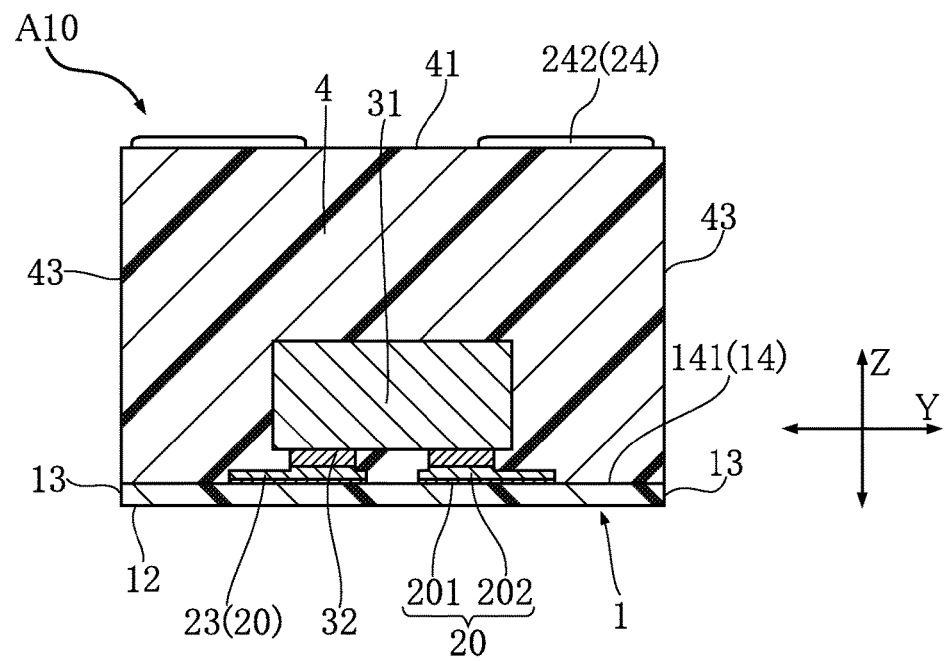
FIG. 3 is a cross-sectional view taken along a line III-III in FIG. 1.
Figure 4:
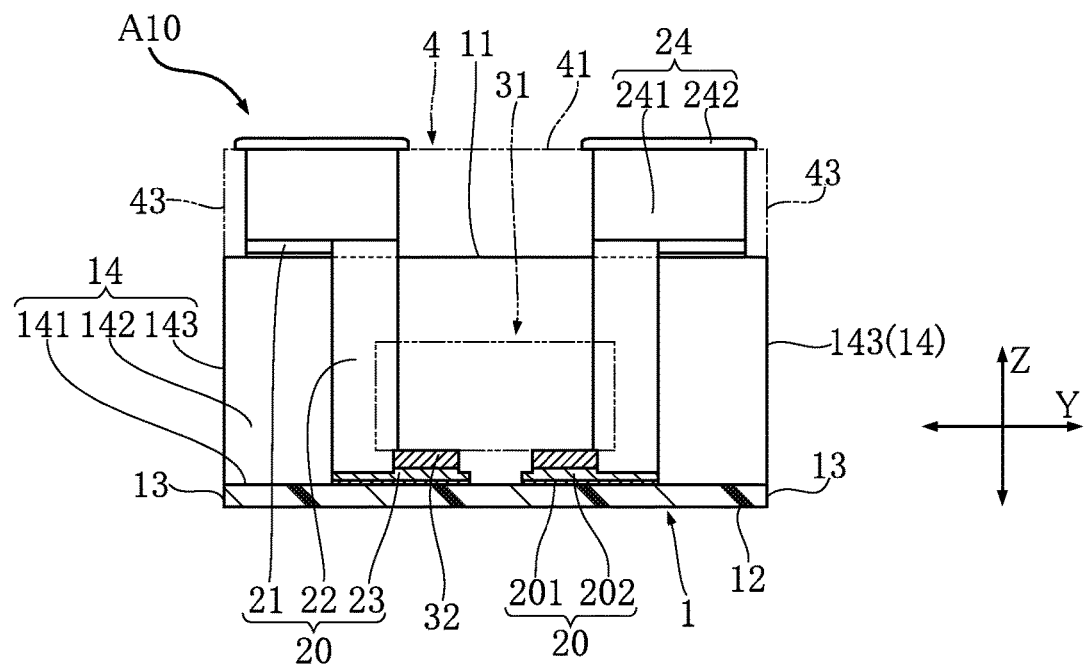
FIG. 4 is a cross-sectional view corresponding to FIG. 3.
Figure 5:
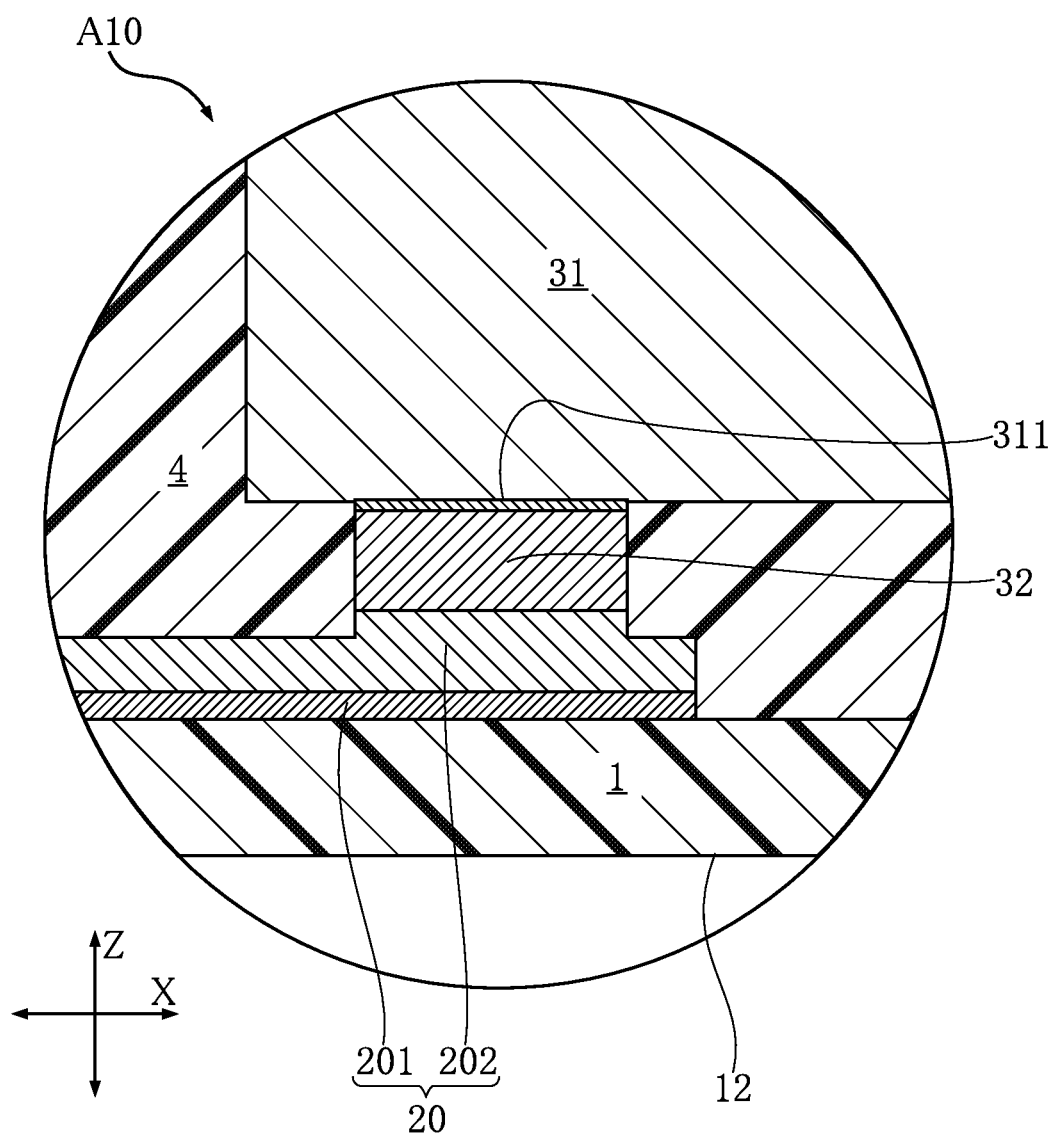
FIG. 5 is an enlarged fragmentary cross-sectional view of a portion in FIG. 2.

FIG. 1 is a plan view showing the semiconductor device A10 (with sealing resin 4 omitted for clarity). FIG. 2 is a cross-sectional view taken along a line II-II (dash-dot line) in FIG. 1. FIG. 3 is a cross-sectional view taken along a line III-III in FIG. 1. FIG. 4 is a cross-sectional view corresponding to that of FIG. 3 except that a semiconductor element 31 and a sealing resin 4 are indicated by imaginary lines. FIG. 5 is an enlarged fragmentary cross-sectional view of a portion in FIG. 2.

The semiconductor device A10 according to this embodiment includes a substrate 1, a conductive layer 20, a plurality of terminals 24, a semiconductor element 31, a bonding layer 32, and a sealing resin 4. The semiconductor device A10 may be mounted on a circuit board of various electronic apparatuses, and in this embodiment, the semiconductor element 31 is a magnetic sensor utilizing a Hall-effect element. The semiconductor device A10 may have a rectangular shape in plan view (i.e., as viewed in the thickness direction Z of the substrate 1).

The substrate 1, with the semiconductor element 31 mounted thereon, serves as a base of the semiconductor device A10. In this embodiment, the substrate 1 is constituted of a black synthetic resin that is electrically insulative, and the synthetic resin is, for example, an epoxy resin containing a filler. In this embodiment the filler is made of $SiO_2$, and the percentage of the filler contained in the epoxy resin is 80 to 90%. As shown in FIG. 1, the substrate 1 has a rectangular shape, with two longer sides extending in the first direction X. The substrate 1 includes a main surface 11, a back surface 12, side faces 13, and a recess 14.

The main surface 11 corresponds to the top surface of the substrate 1 shown in FIG. 2 and FIG. 4. The plurality of terminals 24 are formed on the main surface 11, and hence the semiconductor device A10 is mounted on a circuit board with the main surface 11 facing the circuit board. The back surface 12 corresponds to the bottom surface of the substrate 1 shown in FIG. 2 and FIG. 4. When the semiconductor device A10 is mounted on the circuit board, the back surface 12 faces away from the circuit board. As is apparent from FIG. 2 and FIG. 4, the main surface 11 and the back surface 12 are both orthogonal to the thickness direction Z of the substrate 1. The main surface 11 and the back surface 12 face in mutually opposite directions in the thickness direction Z. The main surface 11 and the back surface 12 are both flat. As shown in FIG. 1 and FIG. 2, the substrate 1 includes a recess 14 that recedes from the main surface 11. Due to the recess 14, the main surface 11 is divided into two rectangular portions in plan view (see FIG. 1), spaced from each other in the first direction X.

As shown in FIG. 2 and FIG. 4, the side faces 13 are four faces each extending between the main surface 11 and the back surface 12 and oriented outward in the first direction X or in the second direction Y. The side faces 13 are all flat, and orthogonal to the main surface 11 and the back surface 12. In this embodiment, an opening 143 (to be described below) of the recess 14 is formed in each of the two side faces 13 that are opposite to each other in the second direction Y.

As shown in FIG. 1 to FIG. 3, the recess 14 is formed so as to recede from the main surface 11, housing the semiconductor element 31. The recess 14 does not extend throughout the substrate 1 in the thickness direction Z. In this embodiment, the recess 14 has a bottom surface 141, an intermediate connection surface 142 and an opening 143. The bottom surface 141 includes a region where the semiconductor element 31 is to be mounted. In this embodiment, the bottom surface 141 is flat and orthogonal to the thickness direction Z. The bottom surface 141 has a rectangular shape in plan view.

As shown in FIG. 1 and FIG. 2, the intermediate surface 142 is connected to the main surface 11 and the bottom surface 141. In the thickness direction Z of the substrate 1, the upper end of the intermediate surface 142 shown in FIG. 2 is connected to the main surface 11, and the lower end of the intermediate surface 142 shown in FIG. 2 is connected to the bottom surface 141. The intermediate surface 142 is flat and inclined with respect to the bottom surface 141. In this embodiment, the intermediate surface 142 includes two surfaces spaced from each other in the first direction X. The intermediate surfaces 142 are inclined with respect to the bottom surface 141 at the same angle, which is 54.74°.

As shown in FIG. 1 and FIG. 4, the opening 143 is formed in each of the pair of side faces 13 spaced from each other in the second direction Y. Accordingly, the openings 143 can be thought as a pair of regions spaced in the second direction Y. Each opening 143 has a trapezoidal shape (see FIG. 2) having an (imaginary) upper base longer than a lower base (corresponding to one of the sides of the bottom surface 141 spaced in the second direction Y). In this embodiment, the sealing resin 4 is exposed from both openings 143.

As seen from the above-noted configuration of the substrate 1, the cross-sectional shape of the recess 14 taken orthogonally to the second direction Y is uniform and identical to the shape of the opening 143.

The conductive layer 20 constitutes, together with the plurality of terminals 24, a conduction path between the semiconductor device A10 and an external circuit board. As shown in FIG. 1, the conductive layer 20 is formed on the main surface 11, the bottom surface 141, and the pair of intermediate surfaces 142 of the substrate 1. As shown in FIG. 2, FIG. 3, and FIG. 5, the conductive layer 20 is electrically connected to the semiconductor element 31 via the bonding layer 32.

As shown in FIG. 2 to FIG. 5, the conductive layer 20 includes a seed layer 201 and a plated layer 202 stacked thereon. The seed layer 201 is disposed between the substrate 1 and the plated layer 202. In this embodiment, the seed layer 201 and the plated layer 202 are both made of Cu. The seed layer 201 is formed to facilitate the plated layer 202 to be smoothly formed. In this embodiment, the seed layer 201 has a thickness of 200 to 300 nm, and the plated layer 202 has a thickness of 3 to 10 µm. The plated layer 202 is thicker than the seed layer 201.

The conductive layer 20 includes a main surface conductive portion 21, an intermediate surface conductive portion 22, and a bottom surface conductive portion 23.

As shown in FIG. 1, the main surface conductive portion 21 of this embodiment includes four rectangular parts in plan view, each formed on the main surface 11. Each rectangular part of the main surface conductive portion 21 is formed along an intersection between the main surface and the intermediate surface 142. The main surface conductive portion 21 (each rectangular part in this embodiment) is connected to the intermediate surface conductive portion 22 at the intersection. As shown in FIG. 2 and FIG. 4, the plurality of terminals 24 are each formed on a corresponding one of the rectangular parts of the main surface conductive portion 21.

As shown in FIG. 1 and FIG. 4, the intermediate surface conductive portion 22 is a strip-shaped portion in plan view, formed on each of the pair of intermediate surfaces 142. In this embodiment, the intermediate surface conductive portion 22 extends parallel to the first direction X. In the thickness direction Z of the substrate 1, the upper end of the intermediate surface conductive portion 22 shown in FIG. 2 is connected to the main surface conductive portion 21, and the lower end of the intermediate surface conductive portion 22 shown in FIG. 2 is connected to the bottom surface conductive portion 23.

As shown in FIG. 1, the bottom surface conductive portion 23 of this embodiment includes four L-shaped parts in plan view, formed on the bottom surface 141. In this embodiment, the bottom surface conductive portion 23 is connected to the intermediate surface conductive portion 22 at the intersection between the bottom surface 141 and the intermediate surface 142, and extends in the first direction X from the intersection (first extension) and then bent in the second direction Y (second extension). As shown in FIG. 1 to FIG. 3, the bonding layer 32 is formed on the second extension of the bottom surface conductive portion 23, which extends in the second direction Y. The semiconductor element 31 is mounted on and connected to the bottom surface conductive portion 23 via the bonding layer 32.

The plurality of terminals 24 are utilized to attach the semiconductor device A10 onto a circuit board. The terminals 24 are each connected to the main surface conductive portion 21. The terminals 24 are electrically connected to the semiconductor element 31 via the conductive layer 20 and the bonding layer 32. In this embodiment, the terminals 24 each include a columnar portion 241 and a pad portion 242 (see e.g. FIG. 2).

As shown in FIG. 1, FIG. 2, and FIG. 4, the columnar portion 241 is electrically connected to the main surface conductive portion 21. In the thickness direction Z of the substrate 1, the lower end of the columnar portion 241 shown in FIG. 2 and FIG. 4 is connected to the main surface conductive portion 21, and the upper end of the columnar portion 241 shown in FIG. 2 and FIG. 4 is flush with the upper surface of the sealing resin 4 and exposed from the sealing resin 4. The columnar portion 241 may be made of Cu and have a circular cross section, as seen from FIG. 1.

As shown in FIG. 1, each pad portion 242 has a rectangular shape in plan view. In the thickness direction Z of the substrate 1, the pad portion 242 is formed in contact with the portion of the columnar portion 241 exposed from the sealing resin 4 (upper end of the columnar portion 241 shown in FIG. 2 and FIG. 4). In addition, the pad portion 242 overlaps with the entirety of the main surface conductive portion 21 and the columnar portion 241, and a part of the sealing resin 4 in plan view. In this embodiment, the pad portion 242 is composed of a Ni layer, a Pd layer, and a Au layer stacked on each other.

Here, the positional arrangement of the conductive layer 20 and the plurality of terminals 24 shown in FIG. 1 is merely exemplary, and different arrangements may be adopted to manufacture the semiconductor device A10.

The semiconductor element 31 is, as shown in FIG. 1 to FIG. 3, mounted on the bottom surface conductive portion 23 formed on the bottom surface 141, via the bonding layer 32. In this embodiment, the semiconductor element 31 is a Hall-effect element. Including the Hall-effect element, the semiconductor device A10 serves as a magnetic sensor. In this embodiment, the Hall-effect element is of a GaAs type. The GaAs Hall-effect element is excellent in linearity of the hall voltage with respect to the change of magnetic flux, and not susceptible to temperature fluctuation. A non-illustrated magneto-sensitive surface, for detecting variation of magnetic flux caused by a magnet located outside the semiconductor device A10, is formed on the lower surface of the semiconductor element 31 in FIG. 2 and FIG. 3. In addition, as shown in FIG. 5, an electrode bump 311 is formed on the lower surface of the semiconductor element 31. The electrode bump 311 is made of Cu for example, and held in contact with the bonding layer 32. The electrode bump 311 may have a rectangular shape in plan view, for example.

The bonding layer 32 is a conductive member disposed between the electrode bump 311 and the bottom surface conductive portion 23 of the conductive layer 20, as shown in FIG. 2, FIG. 3, and FIG. 5. The semiconductor element 31 is bonded onto the bottom surface conductive portion 23 by the bonding layer 32, so that the electrical conduction between the semiconductor element 31 and the bottom surface conductive portion 23 can be made. In this embodiment, the bonding layer 32 is made up of, for example, a Ni layer and an Sn-based alloy layer stacked on the Ni layer. The Sn-based alloy layer may be made of a lead-free solder such as an Sn—Sb alloy or Sn—Ag alloy.

The sealing resin 4 is, as shown in FIG. 2 and FIG. 3, filled in the recess 14 so as to cover the main surface 11 except the region where the columnar portion 241 is formed. In addition, the sealing resin 4 covers the semiconductor element 31. In this embodiment, the sealing resin 4 is made of the same material as that of the substrate 1. More specifically, the sealing resin 4 is made of an electrically insulative black epoxy resin containing a filler including SiO$_2$. The sealing resin 4 includes a main surface 41 and side faces 43. The main surface 41 and the side faces 43 are exposed in the semiconductor device A10.

As shown in FIG. 2 and FIG. 3, the main surface 41 is a flat surface oriented in the same direction as the main surface 11. In this embodiment, the main surface 41 is flush with the upper end of the plurality of columnar portions 241 shown in FIG. 2 and FIG. 4. The side faces 43 include four surfaces extending between the main surface 41 and the substrate 1 and oriented outward in the first direction X and in the second direction Y. The side faces 43 are all flat, and flush with the respective side faces 13 of the substrate 1. Out of the four side faces 43, a pair of side faces 43 spaced in the second direction Y are exposed from the opening 143.

Referring now to FIG. 6 to FIG. 21, a manufacturing method of the semiconductor device A10 will be described hereunder. FIG. 6 to FIG. 20 are cross-sectional views for explaining processes in the manufacturing method of the semiconductor device A10, except FIG. 9. The cross-sectional views correspond to the cross-sectional view shown in FIG. 2. FIG. 9 is a perspective view showing a substrate 81 obtained after the process shown in FIG. 8. FIG. 21 is a plan view showing a process in the manufacturing method of the semiconductor device A10, subsequent to the process of FIG. 20. For the purpose of the description, a left-right direction in a cross-sectional view will be referred to as first direction X, an up-down direction in the cross-sectional view, perpendicular to the first direction X, will be referred to as thickness direction Z of the substrate 81, and a depth direction of the cross-sectional view perpendicular to both of the first direction X and the thickness direction Z will be referred to as second direction Y.

Figure 6:
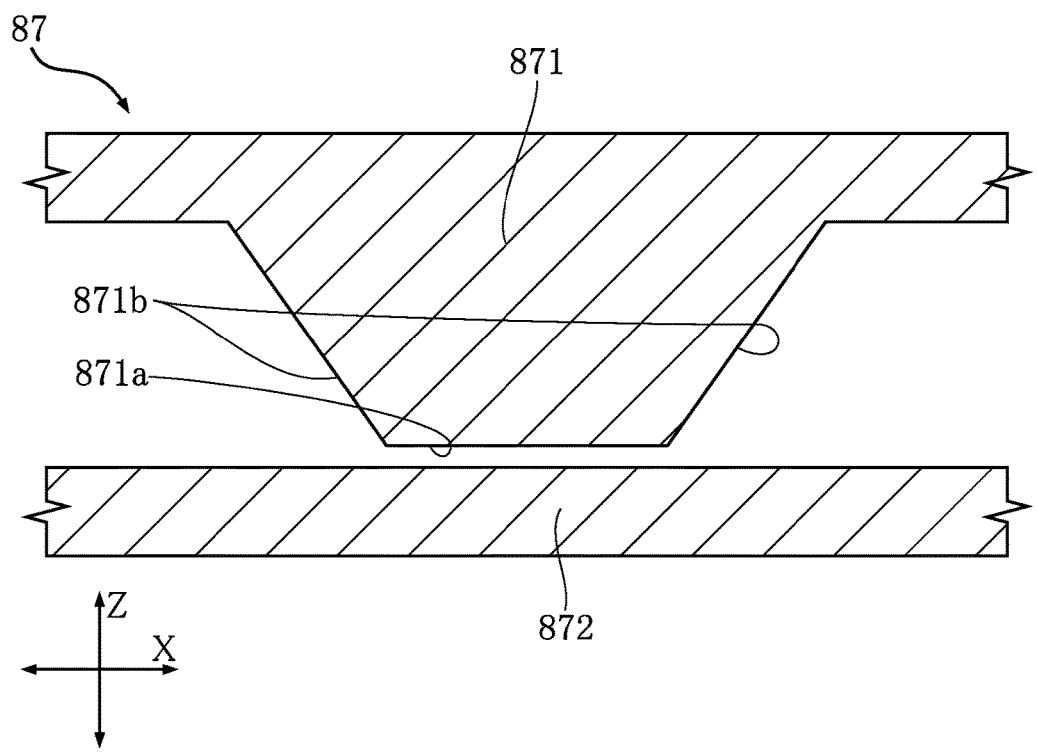
FIG. 6 is a cross-sectional view showing a process in a manufacturing method of the semiconductor device shown in FIG. 1.

First, a mold 87 is prepared as shown in FIG. 6. The mold 87 includes an upper mold 871 and a lower mold 872. The upper mold 871 includes a protruding portion having a top surface 871a and a pair of sloped surfaces 871b. A plurality of protruding portions are formed at regular intervals in the first direction X. The cross-sectional shape of the protruding portion taken orthogonally to the second direction Y is uniform, which is a trapezoid. The lower mold 872 is flat both in the first direction X and in the second direction Y. The mold 87 is made of a monocrystalline semiconductor material, and in this embodiment monocrystalline silicon is used. The upper mold 871 is formed by anisotropic etching with an alkaline solution. The alkaline solution may be, for example, a potassium hydroxide (KOH) solution or a tetramethyl ammonium hydroxide (TMAH) solution. When the top surface 871a is made to be a (100) surface, then each sloped surface 871b will be a (111) surface. In this case, the top surface 871a and the respective sloped surfaces 871b form the same acute angle, i.e., 54.74°.

Figure 7:
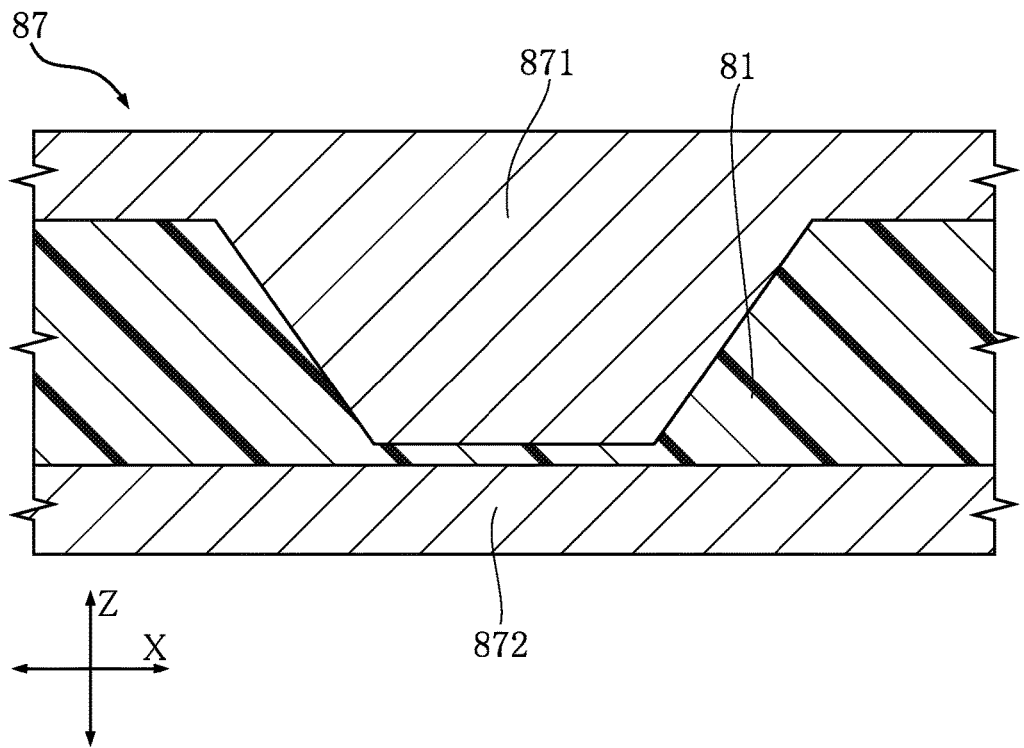
FIG. 7 is a cross-sectional view showing a process in the manufacturing method of the semiconductor device shown in FIG. 1.

Referring to FIG. 7, the substrate 81 is formed by resin molding with the mold 87, from an electrically insulative black synthetic resin. In this embodiment, a transfer molding method is employed for the resin molding. For example, a non-illustrated fluorine-based release agent is applied to the upper mold 871 and the lower mold 872, after which molten synthetic resin is introduced in the gap defined between the upper mold 871 and the lower mold 872, and the synthetic resin is cured by heating. In this embodiment, the synthetic resin is an epoxy resin containing a filler made of SiO$_2$.

Figure 8:
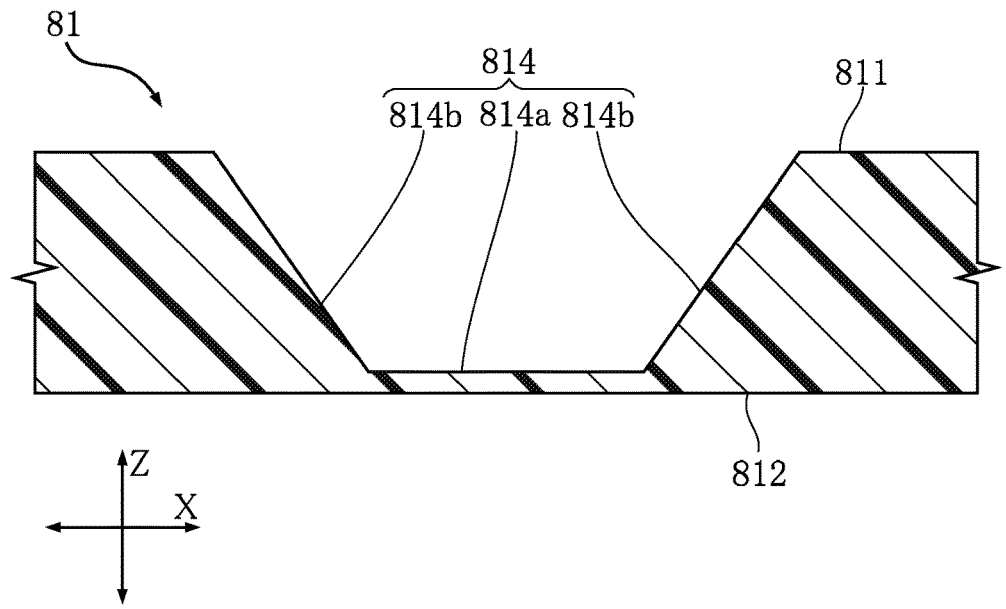
FIG. 8 is a cross-sectional view showing a process in the manufacturing method of the semiconductor device shown in FIG. 1.
Figure 9:
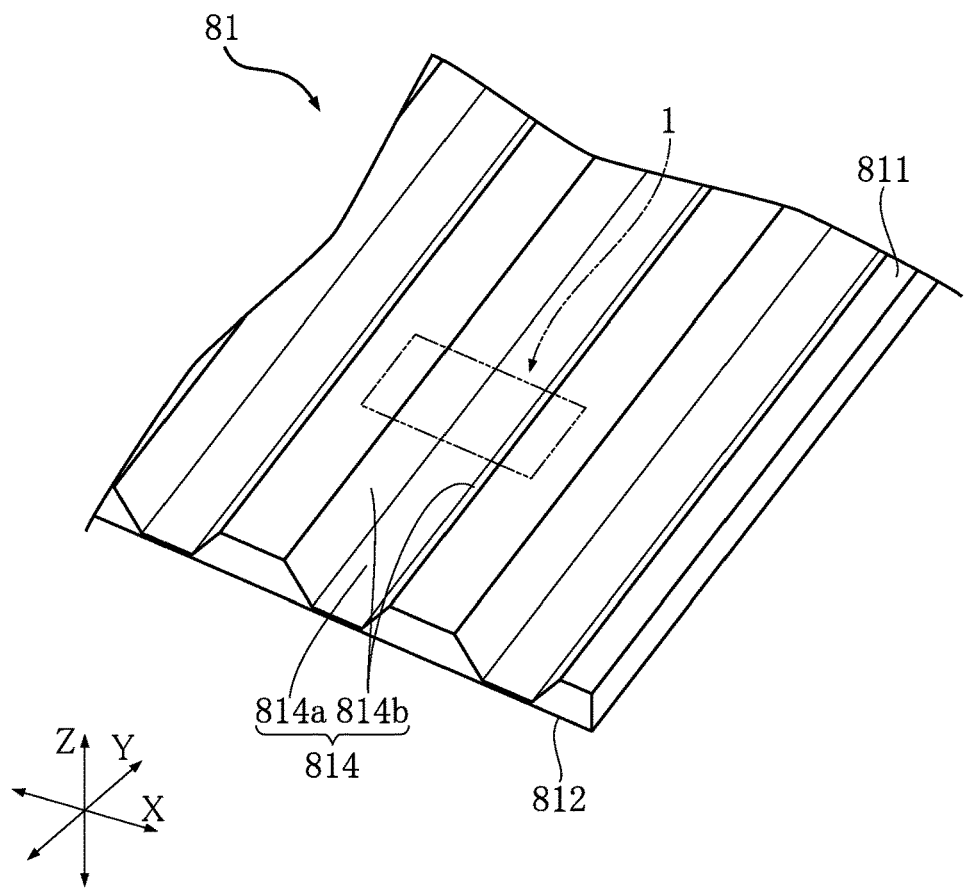
FIG. 9 is a perspective view showing a substrate obtained after the process shown in FIG. 8.

Proceeding to FIG. 8, the molded substrate 81 is taken out from the mold 87. The substrate 81 is an aggregation of the substrates 1 of the semiconductor device A10. The substrate 81 includes a main surface 811, a back surface 812, and grooves 814. In this embodiment, the grooves 814 are formed so as to recede from the main surface 811. The grooves 814 each include a bottom surface 814a and a pair of intermediate surfaces 814b. The bottom surface 814a is flat, and orthogonal to the thickness direction Z of the substrate 81. The pair of intermediate surfaces 814b are spaced from each other in the first direction X, each being connected to the main surface 811 and the bottom surface 814a and inclined with respect to the bottom surface 814a. In this embodiment, because of the resin molding process with the mold 87 for forming the substrate 81, the pair of intermediate surfaces 814b can be formed at the same inclination angle with respect to the bottom surface 814a, which is 54.74°.

FIG. 9 is a perspective view of the substrate 81 which has just been taken out from the mold 87. As shown in FIG. 9, a plurality of grooves 814 spaced from each other at regular intervals in the first direction X are formed in the substrate 81 so as to recede from the main surface 811. The grooves 814 all extend in the second direction Y. For reference, a region on the substrate 81 corresponding to the substrate 1 of the semiconductor device A10 is indicated by two-dot chain lines in FIG. 9.

Then a conductive layer 82 is formed on the substrate including the grooves 814. The process to form the conductive layer 82 includes forming a seed layer 821, forming a mask on the seed layer 821, and forming a plated layer 822.

Figure 10:
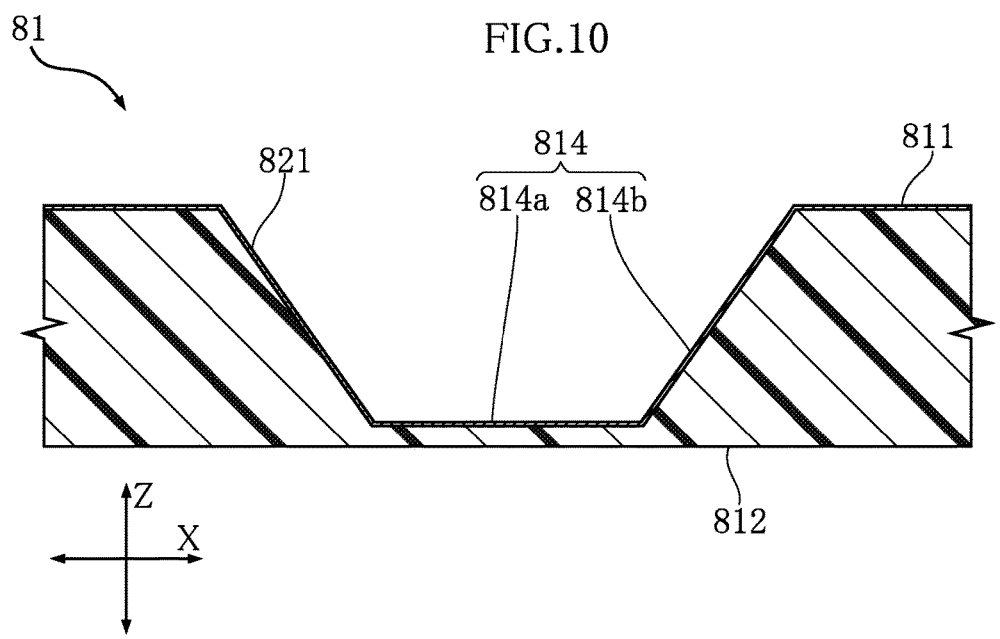
FIG. 10 is a cross-sectional view showing a process in the manufacturing method of the semiconductor device shown in FIG. 1.

First, as shown in FIG. 10, a seed layer 821 is formed on the substrate 81. The seed layer 821 is formed over the entirety of the main surface 811 and the grooves 814. The seed layer 821 is formed by sputtering. In this embodiment, the seed layer 821 is made of Cu in a thickness of 200 to 300 nm.

Figure 11:
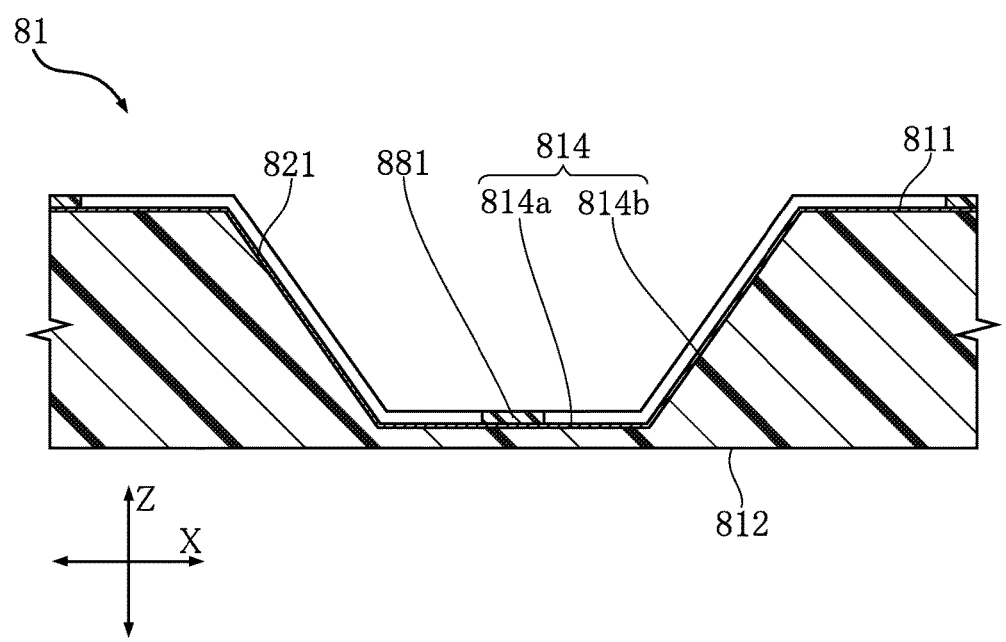
FIG. 11 is a cross-sectional view showing a process in the manufacturing method of the semiconductor device shown in FIG. 1.

Then a mask is formed over the seed layer 821 by photolithography. Referring to FIG. 11, a first resist layer 881 is formed on the substrate 81, after which exposure and development are performed over the first resist layer 881, so as to form the mask on the seed layer 821. The first resist layer 881 is formed over the same region where the seed layer 821 is formed. The first resist layer 881 may be formed, for example, by spraying a resist over the seed layer 821. In this embodiment, the resist is a positive resist, and therefore the exposed portion of the first resist layer 881 is removed by a solution used for the development.

Figure 12:
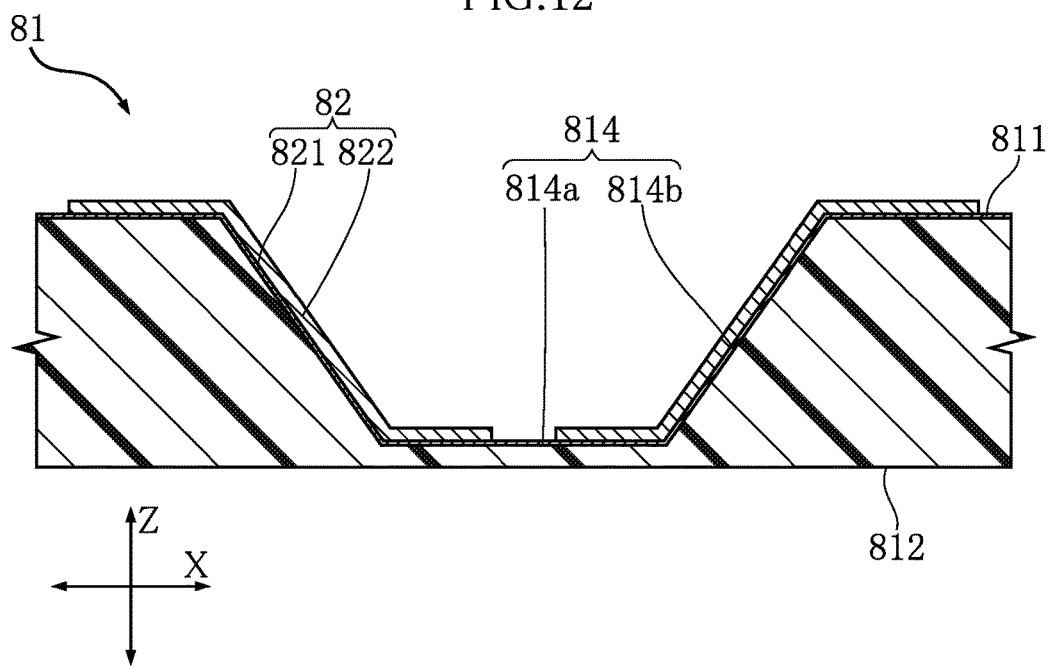
FIG. 12 is a cross-sectional view showing a process in the manufacturing method of the semiconductor device shown in FIG. 1.

As shown in FIG. 12, after the plated layer 822 is formed on the substrate 81, the first resist layer 881 remaining on the substrate 81 is thoroughly removed. The plated layer 822 is formed in the region where the first resist layer 881 is removed in the developing process, in other words where the seed layer 821 is exposed. The plated layer 822 is formed by electrolytic plating. In this embodiment, the plated layer 822 is made of Cu in a thickness of thickness 3 to 10 μm. Through the mentioned process, the conductive layer 82 is formed on the substrate 81.

Figure 13:
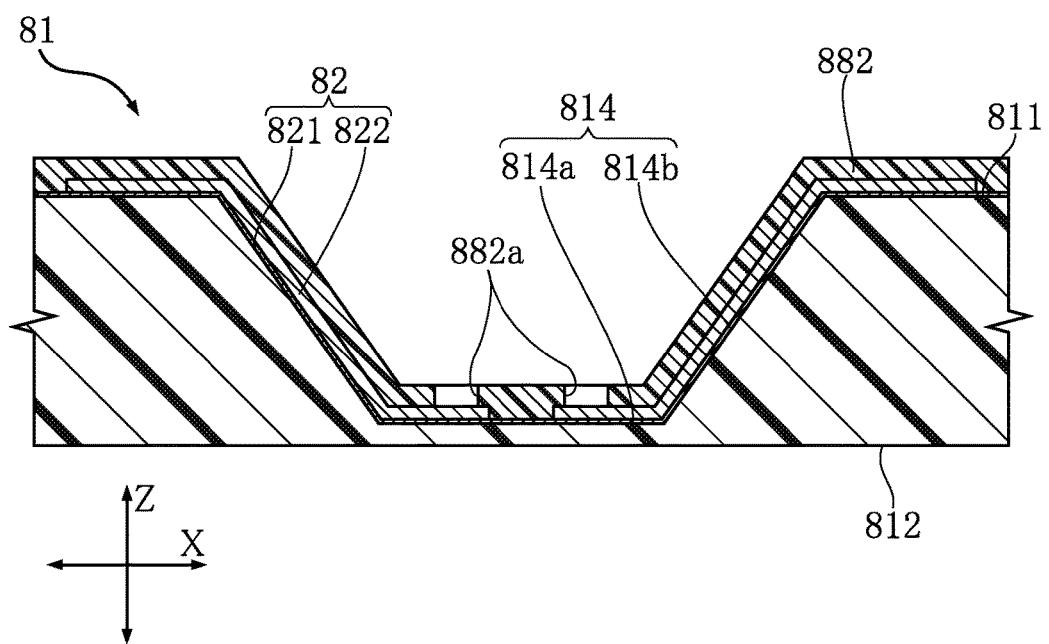
FIG. 13 is a cross-sectional view showing a process in the manufacturing method of the semiconductor device shown in FIG. 1.

Then a bonding layer 832, for mounting a semiconductor element 831 as will be subsequently described, is formed on the conductive layer 82. The bonding layer 832 corresponds to the bonding layer 32 of the semiconductor device A10. Referring to FIG. 13, a mask is formed on the conductive layer 82 by photolithography. The mask can be formed on the conductive layer 82 through forming a second resist layer 882 over the substrate 81 and performing exposure and development on the second resist layer 882. The second resist layer 882 may be formed over the same region, of the same material, and by the same method as the first resist layer 881. In this process, a plurality of through-holes 882a are formed in the second resist layer 882. The through-holes 882a are each formed in a rectangular block shape.

Figure 14:
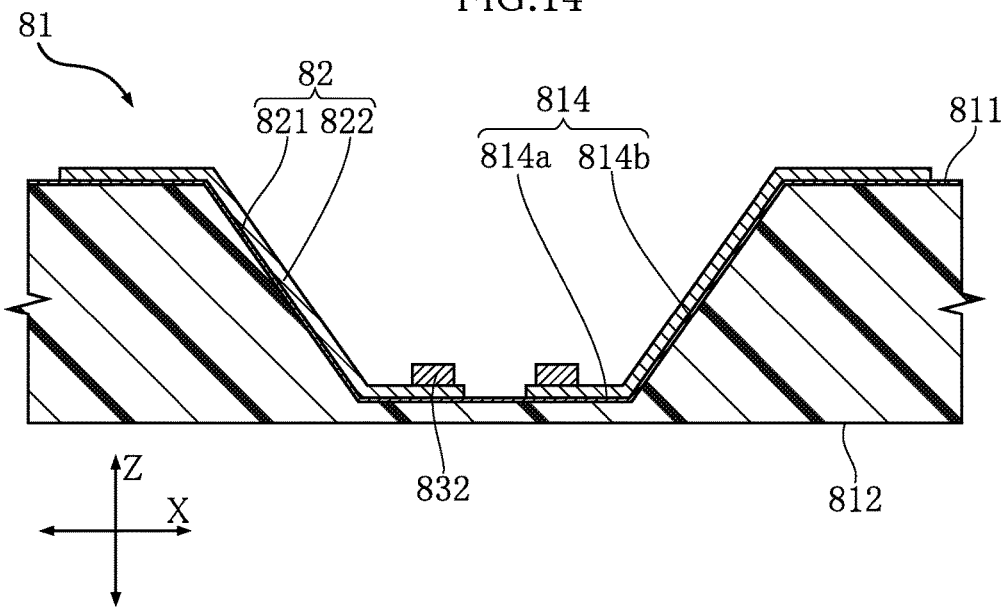
FIG. 14 is a cross-sectional view showing a process in the manufacturing method of the semiconductor device shown in FIG. 1.

As shown in FIG. 14, after the bonding layer 832 is formed on the conductive layer 82, the second resist layer 882 remaining on the substrate 81 is thoroughly removed. The bonding layer 832 is made up of a Ni layer and a Sn-containing alloy layer stacked on the Ni layer, and is electrically conductive. In this embodiment, the forming of the bonding layer 832 is performed by electrolytic plating utilizing the seed layer 821 formed on the substrate 81. Specifically, the Ni layer is deposited on the plated layer 822 exposed via the through-holes 882a, and the Sn-containing alloy layer is deposited on the Ni layer, thereby filling the through-holes 882a. Then, the resist layer 882 is removed, leaving mutually separate portions of the bonding layer 832. As noted above, the Sn-containing alloy may be a lead-free solder such as an Sn—Sb alloy or an Sn—Ag alloy.

Figure 15:
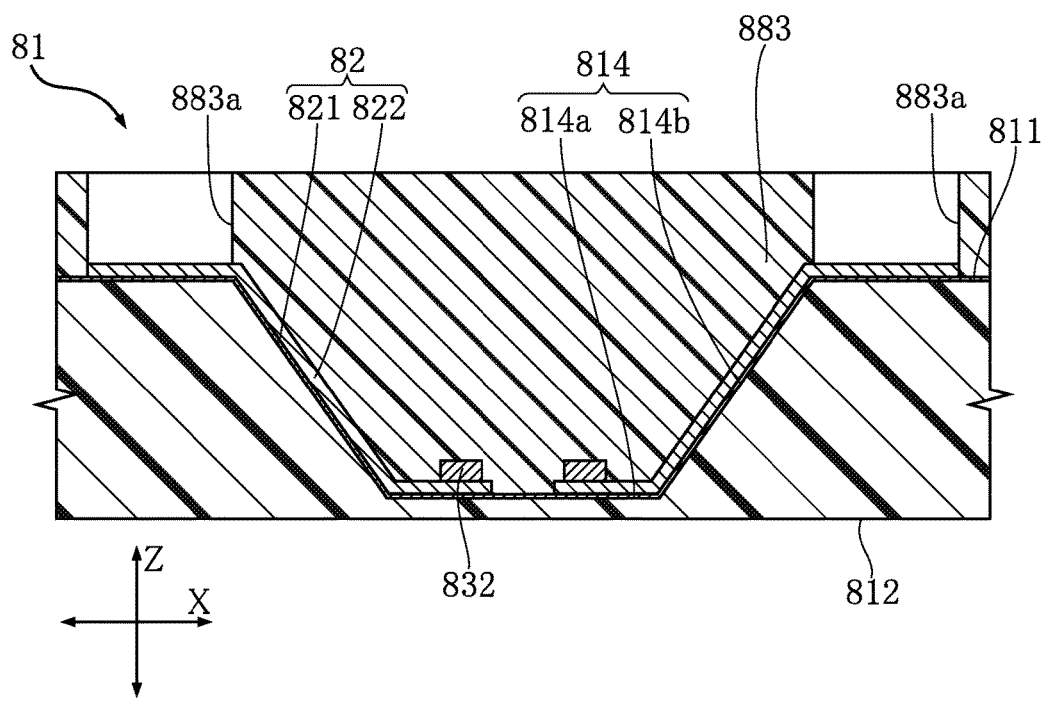
FIG. 15 is a cross-sectional view showing a process in the manufacturing method of the semiconductor device shown in FIG. 1.

Then a plurality of columnar conductors 823 to be electrically connected to the conductive layer 82 on the main surface 811 are formed. The columnar conductor 823 corresponds to the columnar portion 241 of the terminal 24 of the semiconductor device A10. Referring to FIG. 15, a mask is formed on the conductive layer 82 by photolithography. The mask may be formed on the conductive layer 82 through forming a third resist layer 883 on the substrate 81 and performing exposure and development with respect to the third resist layer 883. The third resist layer 883 may be formed over the same region, of the same material, and by the same method as the first resist layer 881. In this process, a plurality of through-holes 883a are formed in the third resist layer 883. The through-holes 883a are formed in a circular column shape, for example.

Figure 16:
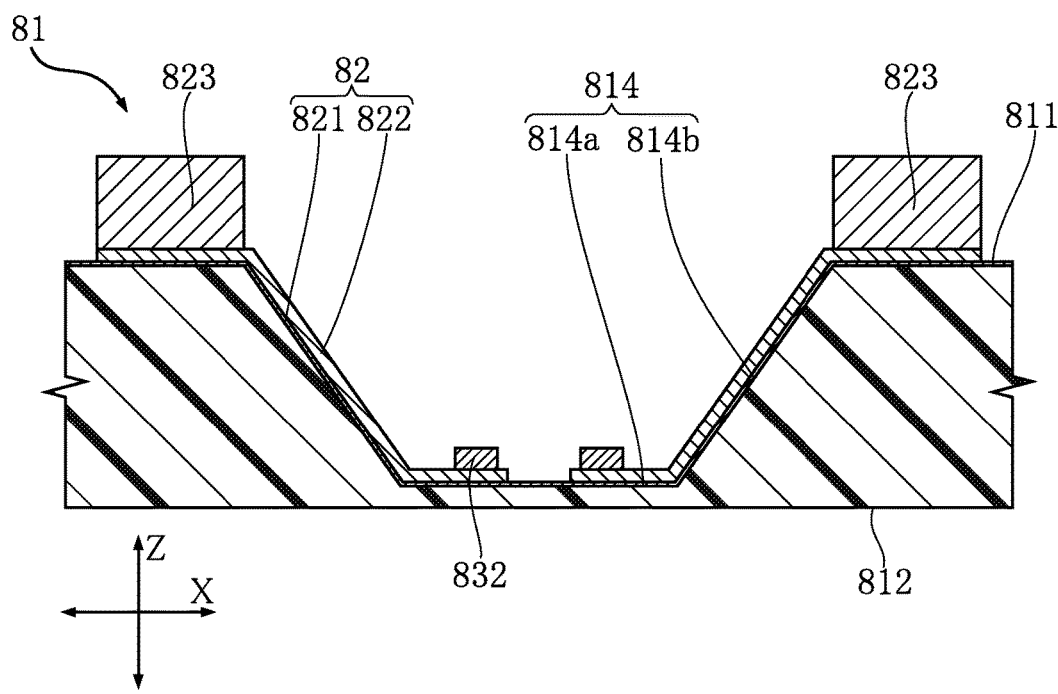
FIG. 16 is a cross-sectional view showing a process in the manufacturing method of the semiconductor device shown in FIG. 1.

As shown in FIG. 16, after the plurality of columnar conductors 823 are formed, the third resist layer 883 on the substrate 81 is thoroughly removed. In this embodiment, the plurality of columnar conductors 823 can be formed so as to fill in the through-holes 883a, for example by depositing Cu on the plated layer 822 exposed in the through-holes 883a by electrolytic plating utilizing the seed layer 821 formed on the substrate 81.

Figure 17:
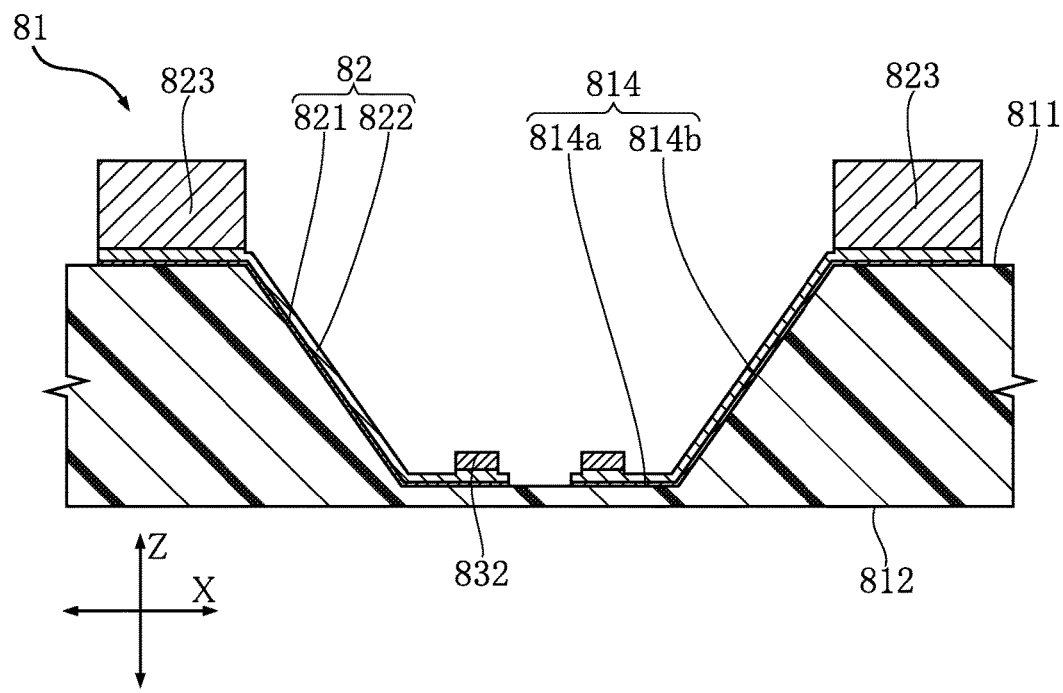
FIG. 17 is a cross-sectional view showing a process in the manufacturing method of the semiconductor device shown in FIG. 1.

As shown in FIG. 17, all the portions of the seed layer 821 that are uncovered with the plated layer 822 and no longer necessary are removed. The seed layer 821 may be removed, for example, by wet etching. The substrate 81 is exposed where the seed layer 821 has been removed. In this process, the thickness of the plated layer 822, the plurality of columnar conductors 823, and the bonding layer 832 are also reduced by the wet etching by an amount corresponding to the film thickness of the seed layer 821. In FIG. 2 to FIG. 5 and FIG. 17 to FIG. 20 illustrating this embodiment, the stepped portions formed through the mentioned process in positions of the plated layer 822 (plated layer 202) adjacent to the plurality of columnar conductors 823 (columnar portion 241) and the bonding layer 832 (bonding layer 32) are illustrated in exaggerated sizes, for clearer understanding. The conductive layer 82 obtained through the mentioned process corresponds to the conductive layer 20 of the semiconductor device A10.

Figure 18:
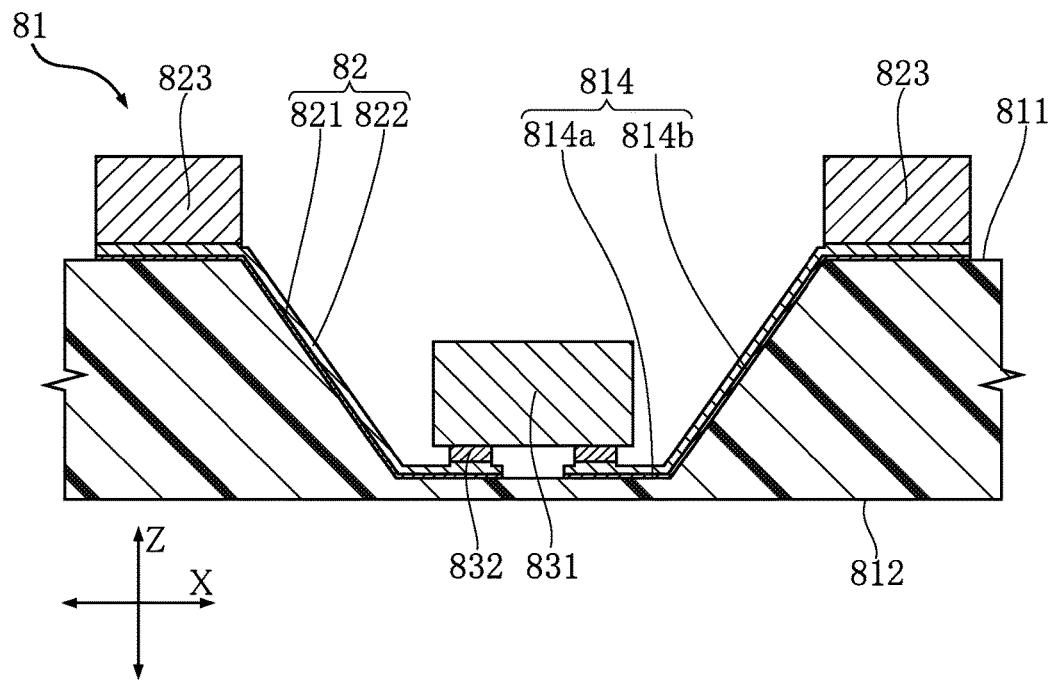
FIG. 18 is a cross-sectional view showing a process in the manufacturing method of the semiconductor device shown in FIG. 1.

As shown in FIG. 18, a semiconductor element 831 is mounted on the bottom surface 814a to be accommodated in the groove 814. The semiconductor element 831 corresponds to the semiconductor element 31 of the semiconductor device A10. The semiconductor element 831 is mounted by flip chip bonding (FCB). Specifically, a non-illustrated flux is applied to the semiconductor element 831, and then the semiconductor element 831 is tentatively placed on the bonding layer 832, for example with a non-illustrated flip chip bonding machine. At this point, the bonding layer 832 is disposed between the conductive layer 82 on the bottom surface 814a and non-illustrated electrode bumps formed on the lower surface of the semiconductor element 831 in FIG. 18. Then the bonding layer 832 is melted by reflow soldering and then solidified by cooling, so that the semiconductor element 831 is securely mounted on the bottom surface 814a.

Figure 19:
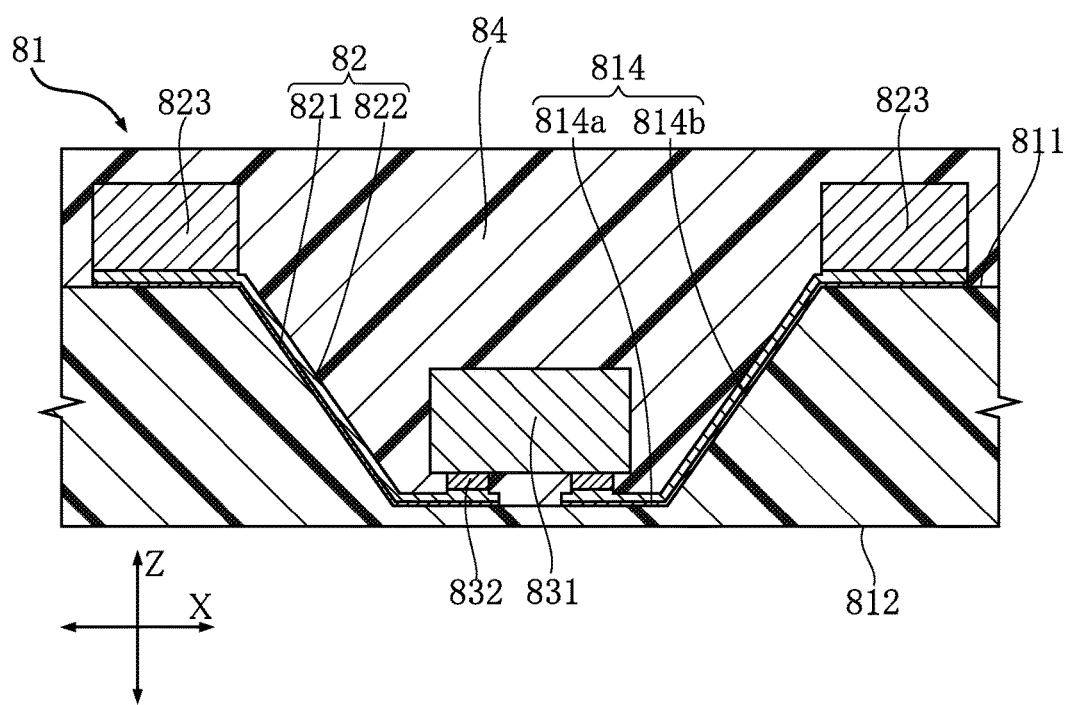
FIG. 19 is a cross-sectional view showing a process in the manufacturing method of the semiconductor device shown in FIG. 1.

As shown in FIG. 19, a sealing resin 84 for covering the semiconductor element 831 is formed on the substrate 81. The sealing resin 84 corresponds to the sealing resin 4 of the semiconductor device A10. The sealing resin 84 is formed so as to fill in the groove 814 formed in the substrate 81 and to completely cover the conductive layer 82 and the semiconductor element 831. In this embodiment, the sealing resin 84 is made of the same material as that of the substrate 81. More specifically, the sealing resin 84 is made of an electrically insulative black epoxy resin containing a filler made of $SiO_2$.

Figure 20:
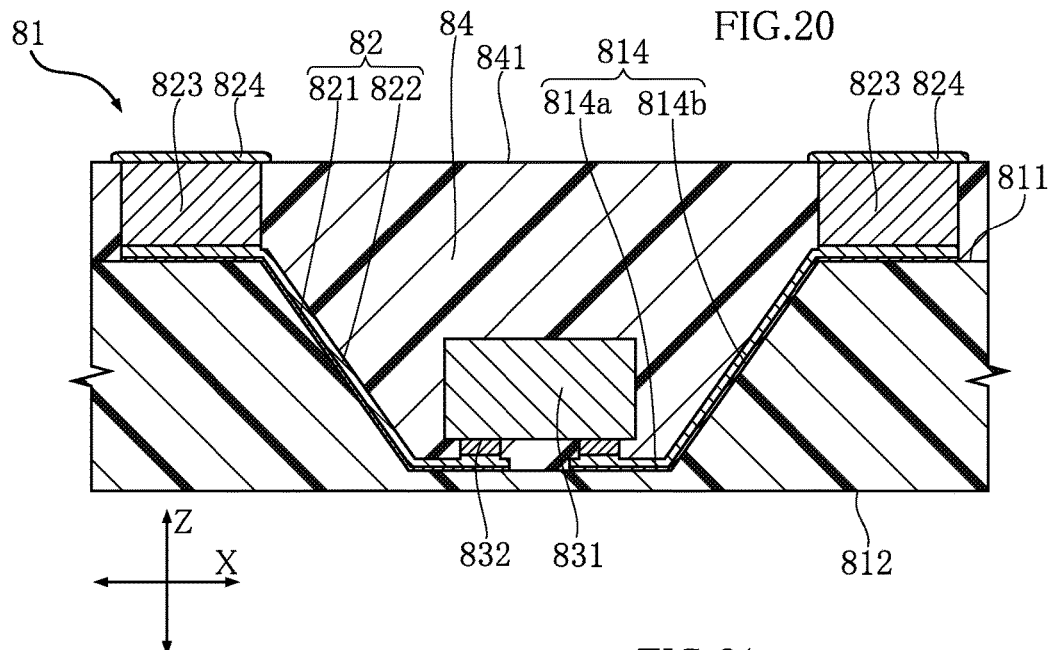
FIG. 20 is a cross-sectional view showing a process in the manufacturing method of the semiconductor device shown in FIG. 1.
Figure 21:
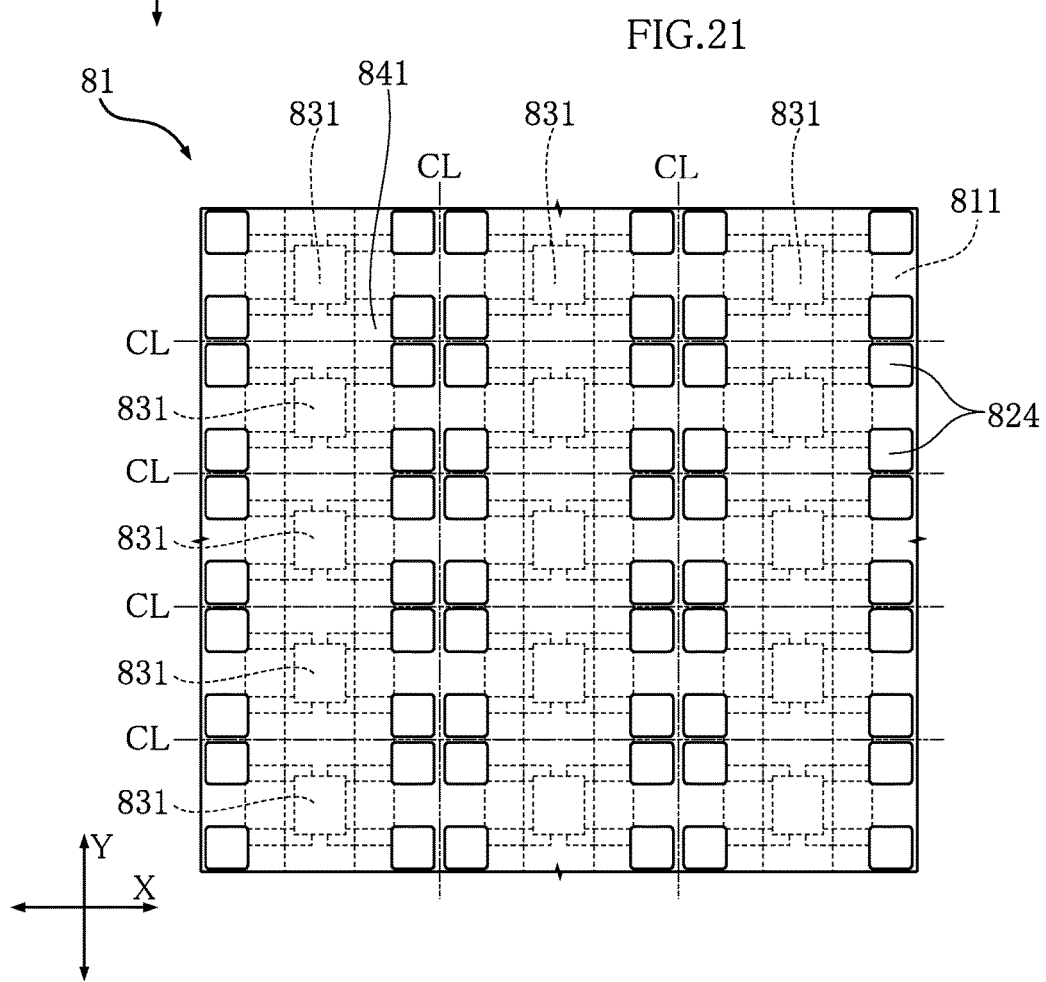
FIG. 21 is a plan view showing a process in the manufacturing method of the semiconductor device shown in FIG. 1.

As shown in FIG. 20, the upper portion of the sealing resin 84 is polished to expose the upper surface of the columnar conductors 823 from the sealing resin 84. At this point, the upper surface of the sealing resin 84 shown in FIG. 20 constitutes a main surface 841, and the respective upper surfaces of the columnar conductors 823 become flush with the main surface 841 of the sealing resin 84. Then pad layers 824 are formed so as to contact the respective bonding layers 832 exposed from the main surface 841 of the sealing resin 84. The pad layer 824 corresponds to the pad portion 242 of the terminal 24 of the semiconductor device A10. In this embodiment, the pad layer 824 may be formed by depositing an Ni layer, a Pd layer and an Au layer by electroless plating.

As shown in FIG. 21, the substrate 81 is cut (diced) along cutting lines CL in the first direction X and the second direction Y, so as to divide the substrate 81 into individual pieces of the respective semiconductor elements 831. To cut the substrate 81, a non-illustrated dicing blade may be employed. The individual pieces each correspond to the semiconductor device A10. Throughout the foregoing process, the semiconductor device A10 can be obtained.

Advantages of the semiconductor device A10 will be described below.

In the above-described embodiment, the substrate 1 of the semiconductor device A10 is made of an electrically insulative synthetic resin, and the recess 14 includes the bottom surface 141 orthogonal to the thickness direction Z of the substrate 1, and the pair of intermediate surfaces 142 that are connected to the main surface 11 and the bottom surface 141 and inclined with respect to the bottom surface 141. Such a configuration makes the thermal expansion rate of the respective materials of the substrate 1 and the sealing resin 4 substantially equal, thereby making the distribution of thermal distortion of the semiconductor device A10 in the thickness direction Z generally uniform. In addition, the substrate 1 and the sealing resin 4 are fitted to each other in the first direction X. Thus, when the substrate 81 is exposed to heat in the heat-curing process of the sealing resin 84 in the manufacturing process of the semiconductor device A10, the substrate 81 and the sealing resin 84 are thermally expanded in a unified manner generally free from influence of the difference in thermal distortion in the first direction X. Consequently, the substrate 81 can be prevented from warping owing to the difference in thermal distortion, during the forming process of the sealing resin 84 in the manufacturing process of the semiconductor device A10.

In the above embodiment, the substrate 1 is made of an epoxy resin containing a filler of $SiO_2$ and therefore has a reduced thermal expansion rate. Accordingly, the extent of the thermal distortion of the substrate 81 caused by heating and cooling in the manufacturing process of the semiconductor device A10 is minimized, which leads to minimized dimensional error of the substrate 81. In addition, the sealing resin 4 is made of the same material as that of the substrate 1, i.e., an epoxy resin containing $SiO_2$ filler. Thus, it is possible to prevent the substrate 81 from warping due to the difference in thermal distortion, during the forming process of the sealing resin 84 of the semiconductor device A10. It should also be noted that the filler made of $SiO_2$ contributes to increasing the hardness of the resulting synthetic resin, and to improving fluidity of the melted resin in the resin molding process.

In the above embodiment, the substrate 1 is made of an electrically insulative synthetic resin. This feature makes it unnecessary to perform a step of forming an insulation layer (made of e.g. $Si_3N_4$) on the substrate 81 (while the step is needed if the substrate is made of e.g. Si), and to perform a step of forming a barrier layer (made of e.g. Ti) which would otherwise be needed for preventing diffusion of the conductive layer 20 to the above-mentioned insulation layer. In addition, the manufacturing cost of the semiconductor device A10 can be reduced compared with a case where the substrate 81 is made of Si.

In the above embodiment, each terminal 24 formed on the main surface 11 includes a columnar portion 241. Accordingly, in the semiconductor device A10 (see FIG. 2, for example), the sealing resin 4 has a portion protruding beyond the main surface 11. The semiconductor element 31 of this embodiment is a Hall-effect element, and the magneto-sensitive surface of the Hall-effect element is on the lower surface of the semiconductor element 31. Such a configuration is advantageous to making short the distance between the magneto-sensitive surface of the element 31 and a magnet provided outside the semiconductor device A10. Hence, it is possible to improve the sensitivity of the Hall-effect element with respect to the magnetic flux change to be detected.

In the above embodiment, the mold 87 used for forming the substrate 81 is made of a monocrystalline semiconductor material (Si), and the mold 87 is prepared by anisotropic etching performed on the semiconductor material. Thus, the mold 87 can be made to the desired design with precision, and hence with equal precision, the resulting substrate 81 is also obtained to the desired design, including the angle of the intermediate surface 142 with respect to the bottom surface 141.

Second Embodiment

Figure 22:
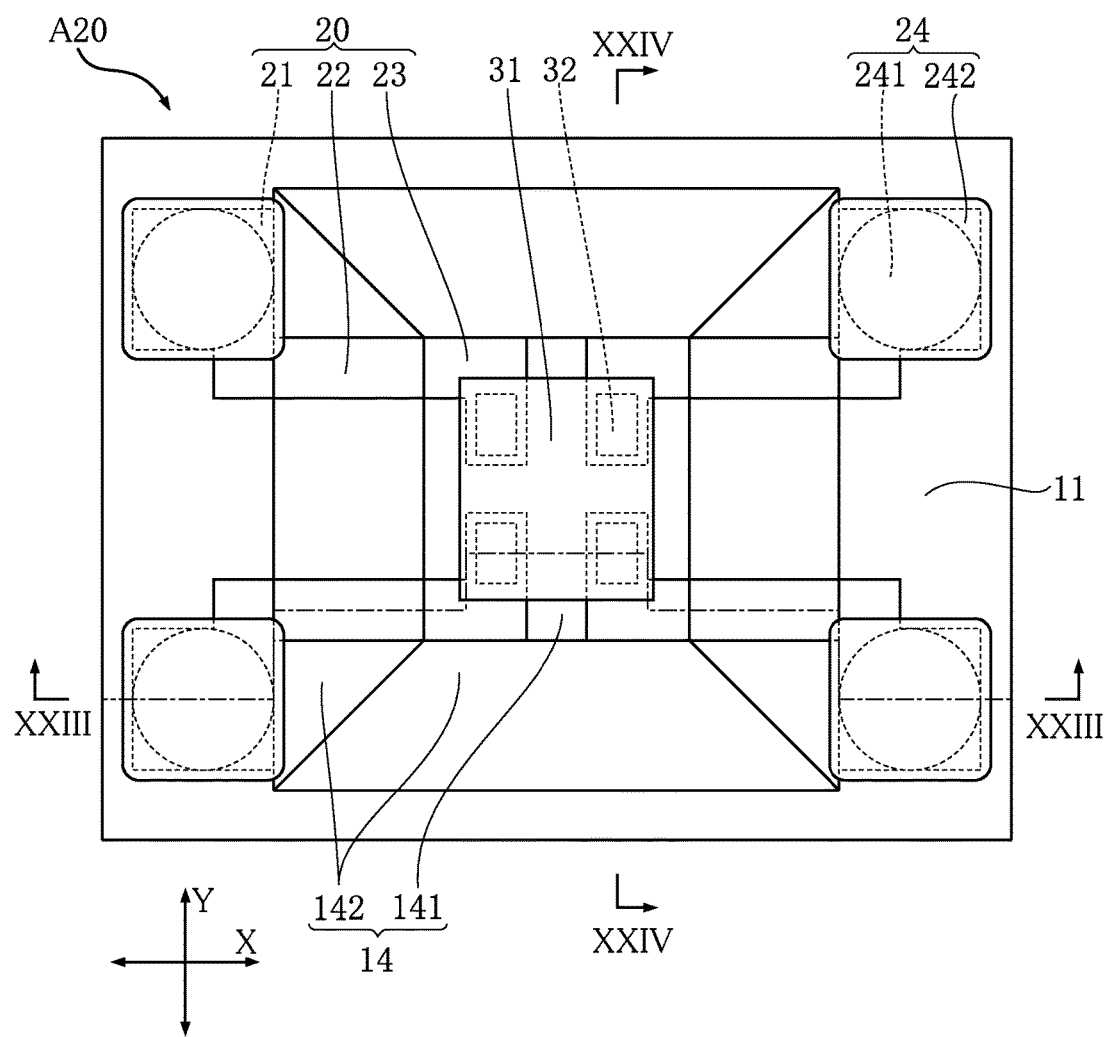
FIG. 22 is a plan view showing a semiconductor device according to a second embodiment of the present invention.
Figure 23:
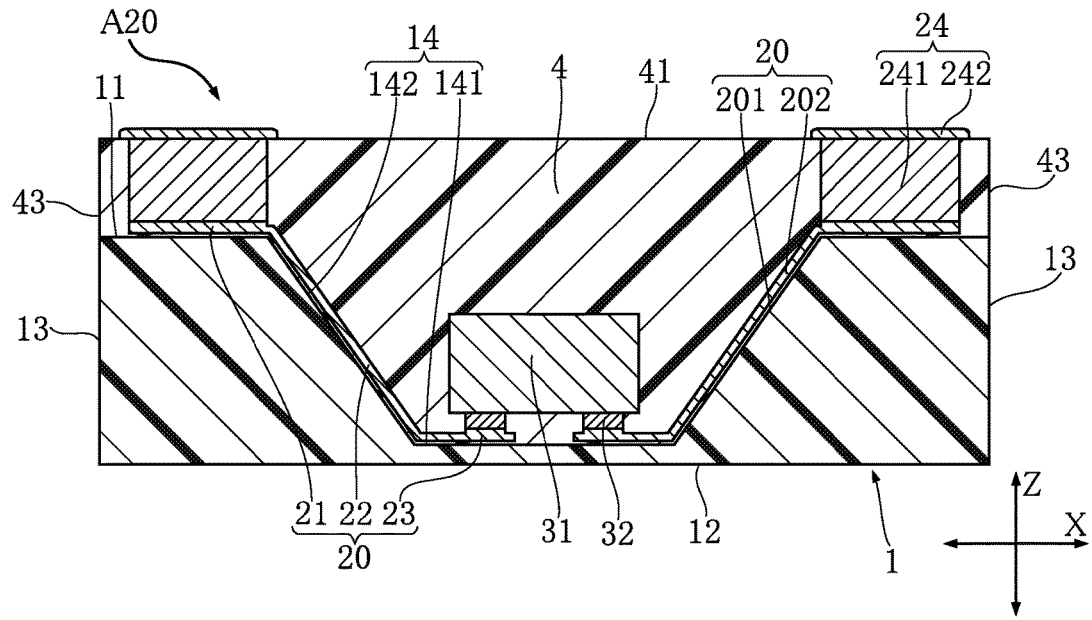
FIG. 23 is a cross-sectional view taken along a line XXIII-XXIII in FIG. 22.
Figure 24:
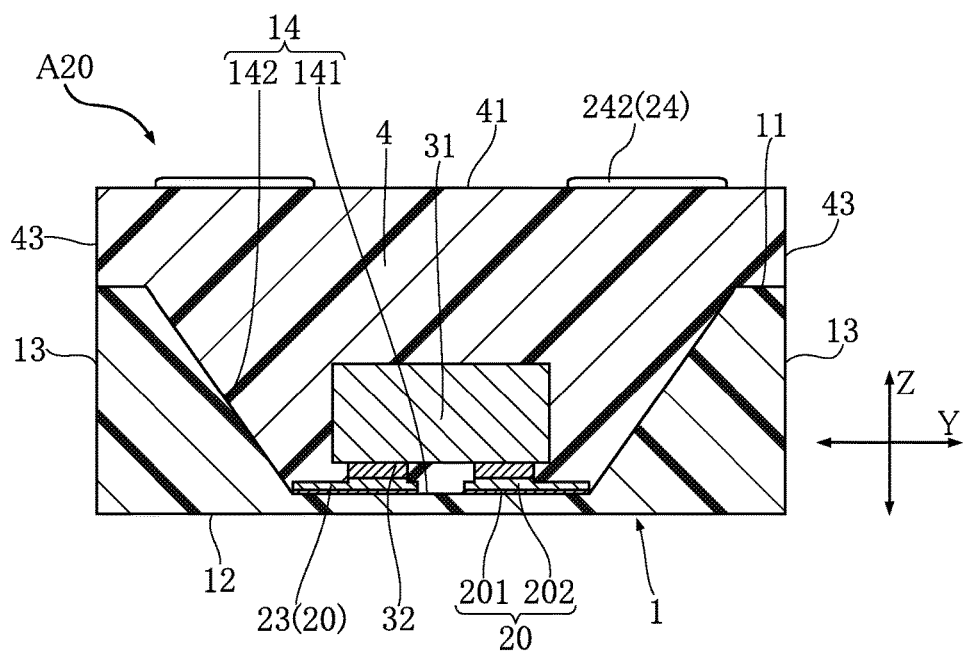
FIG. 24 is a cross-sectional view taken along a line XXIV-XXIV in FIG. 22.

Referring now to FIG. 22 to FIG. 24, a semiconductor device A20 according to a second embodiment of the present invention will be described. In these drawings, the elements same as or similar to those of the semiconductor device A10 described above are given the same numeral, and the description thereof where redundant will not be repeated.

FIG. 22 is a plan view showing the semiconductor device A20. FIG. 23 is a cross-sectional view taken along a line XXIII-XXIII (dash-dot line) in FIG. 22. FIG. 24 is a cross-sectional view taken along a line XXIV-XXIV in FIG. 22. For clarity, the sealing resin 4 is omitted from FIG. 22.

The semiconductor device A20 of the second embodiment is different from the semiconductor device A10 described above in the configuration of the substrate 1, the main surface conductive portion 21, and the sealing resin 4.

As shown in FIG. 22, the substrate 1 of the second embodiment has a larger area (in plan view) than the substrate 1 of the first embodiment, and the main surface 11 is formed in a closed frame shape so as to surround the recess 1 entirely in plan view. In addition, as shown in FIG. 23 and FIG. 24, no opening 143 is formed in each of the two side faces 13 spaced in the second direction Y. Hence, in the second embodiment, all the four side faces 13 have a rectangular shape.

As shown in FIG. 22, in the second embodiment, four intermediate surfaces 142 are provided along the four sides of the bottom surface 141. Each intermediate surface 142 is inclined at the same angle (54.74°) with respect to the bottom surface 141. In the second embodiment, the length of the bottom surface 141 in the second direction Y is shorter than that in the semiconductor device A10. Since no opening 143 is formed, the recess 14 of the second embodiment has a truncated pyramid shape, upside down in FIGS. 23 and 24, with the (imaginary) upper rectangular base being larger in area than the lower rectangular base (bottom surface 141). The conductive layer 20 is formed on the two intermediate surfaces 142 spaced in the first direction X, but not on the other two intermediate surfaces 142 spaced in the second direction Y.

As shown in FIG. 22, in the second embodiment, each main surface conductive portion 21 includes a strip portion in addition to a rectangular main portion (which is provided also for the portion 21 of the first embodiment shown in FIG. 1). The strip portion is shorter in the first direction X than the rectangular portion where the columnar portion 241 is formed. The strip portion is formed along the intersection between the main surface 11 and the intermediate surface 142, and connected to the intermediate surface conductive portion 22.

As shown in FIG. 23 and FIG. 24, the side faces 43 of the second embodiment have a rectangular shape and have the same size in the thickness direction Z of the substrate 1.

The configuration according to the second embodiment also prevents the substrate 81 from warping due to the difference in thermal distortion, as with the first embodiment. In addition, in the second embodiment, the substrate 1 and the sealing resin 4 are unmovably fitted to each other in the first direction X and in the second direction Y. With this feature, the second embodiment is more advantageous than the first embodiment in preventing the substrate 81 from unduly warping while the sealing resin is formed in the manufacturing process of the semiconductor device A20. Specifically, as explained above, the substrate 81 is exposed to heat and undergoes thermal expansion in the heat-curing process of the sealing resin 84 for manufacturing the semiconductor device A20. However, by fitting the substrate 81 and the sealing resin 84 unmovably to each other in two directions X and Y, the substrate 81 and the resin 84 are subjected to unified thermal expansion (while also being substantially free from the difference in thermal distortion in the directions X and Y). Consequently, it is possible to more effectively prevent the warping of the substrate 81.

The semiconductor devices of the present invention are not limited to the foregoing embodiments. The specific configurations of each portion of a semiconductor device according to the present invention may be modified in various manners.

The invention claimed is:
1. A semiconductor device comprising:
a semiconductor element;
a substrate including a main surface and formed with a recess that recedes from the main surface;
a conductive layer formed on the substrate;

a bonding layer electrically connecting the conductive layer to the semiconductor element, the bonding layer comprising a Ni layer and an alloy layer containing Sn; and a sealing resin covering the semiconductor element at least from above, wherein the substrate is made of an electrically insulative synthetic resin containing a filler, the recess includes a bottom surface on which the semiconductor element is mounted and at least one intermediate surface connected to the main surface and the bottom surface, the bottom surface being orthogonal to a thickness direction of the substrate, and the intermediate surface being inclined with respect to the bottom surface, the semiconductor element includes an inner surface that faces and is parallel to the bottom surface of the recess, and a gap between the inner surface and the bottom surface is filled with the sealing resin, the sealing resin covering the semiconductor element at least from above such that an integral part of the sealing resin extends into the gap, the conductive layer includes a bottom surface conductive portion formed on the bottom surface of the recess, the bottom surface conductive portion comprising a flat plate part and a protrusion that protrudes from the flat plate part toward the semiconductor element, both the flat plate part and the protrusion being made of Cu, and the protrusion of the bottom surface conductive portion is connected to the semiconductor element via the bonding layer.

2. The semiconductor device according to claim 1, wherein the synthetic resin comprises an epoxy resin.

3. The semiconductor device according to claim 1, wherein the filler is made of SiO2.

4. The semiconductor device according to claim 1, wherein the bottom surface is rectangular in plan view.

5. The semiconductor device according to claim 4, wherein the at least one intermediate surface comprises a pair of intermediate surfaces spaced apart from each other in a first direction perpendicular to the thickness direction of the substrate, the recess includes a pair of openings spaced apart from each other in a second direction perpendicular to both the thickness direction of the substrate and the first direction, and the sealing resin is exposed from the pair of openings.

6. The semiconductor device according to claim 5, wherein the pair of intermediate surfaces are inclined at a same angle with respect to the bottom surface.

7. The semiconductor device according to claim 4, wherein the at least one intermediate surface comprises a plurality of intermediate surfaces arranged along four sides of the bottom surface, and the plurality of intermediate surfaces are inclined at a same angle with respect to the bottom surface.

8. The semiconductor device according to claim 1, wherein the conductive layer includes a seed layer and a plated layer stacked on each other, the seed layer is disposed between the substrate and the plated layer, and the plated layer comprises the flat plate part and the protrusion.

9. The semiconductor device according to claim 8, wherein the plated layer is thicker than the seed layer.

10. The semiconductor device according to claim 9, wherein the seed layer and the plated layer are both made of Cu.

11. The semiconductor device according to claim 1, wherein the conductive layer includes a main surface conductive portion formed on the main surface, and an intermediate surface conductive portion formed on the intermediate surface.

12. The semiconductor device according to claim 11, further comprising a plurality of terminals electrically connected to the main surface conductive portion, wherein each of the plurality of terminals includes a columnar portion exposed from the sealing resin.

13. The semiconductor device according to claim 12, wherein the columnar portion is made of Cu.

14. The semiconductor device according to claim 12, wherein each of the plurality of terminals includes a pad portion in contact with the columnar portion of said each of the plurality of terminals.

15. The semiconductor device according to claim 14, wherein the pad portion comprises an Ni layer, a Pd layer and an Au layer stacked on each other.

16. The semiconductor device according to claim 1, wherein the semiconductor element is a Hall-effect element.

17. The semiconductor device according to claim 1, wherein the sealing resin and the substrate are made of a same material.

* * * * *